US 9,178,058 B2

(12) United States Patent
Chen et al.

(10) Patent No.: US 9,178,058 B2
(45) Date of Patent: Nov. 3, 2015

(54) RF SWITCH ON HIGH RESISTIVE SUBSTRATE

(71) Applicant: Taiwan Semiconductor Manufacturing Company, Ltd., Hsin-Chu (TW)

(72) Inventors: Chia-Chung Chen, Keelung (TW); Chi-Feng Huang, Zhubei (TW); Shu Fang Fu, Xinpu Township (TW); Tzu-Jin Yeh, Hsin-Chu (TW); Chewn-Pu Jou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/866,886

(22) Filed: Apr. 19, 2013

(65) Prior Publication Data

US 2014/0264635 A1    Sep. 18, 2014

Related U.S. Application Data

(60) Provisional application No. 61/780,002, filed on Mar. 13, 2013.

(51) Int. Cl.
*H01L 29/78* (2006.01)
*H01L 21/336* (2006.01)
(Continued)

(52) U.S. Cl.
CPC .......... *H01L 29/7833* (2013.01); *H01L 21/761* (2013.01); *H01L 21/7624* (2013.01);
(Continued)

(58) Field of Classification Search
CPC .............. H01L 29/105; H01L 29/0847; H01L 27/0922; H01L 29/7833; H01L 21/8249; H01L 29/6659; H01L 21/823878; H01L 21/82285; H01L 27/0623; H01L 27/0826; H01L 27/0629; H01L 29/66772; H01L 21/823418; H01L 21/823468
USPC .................................................. 257/400–420
See application file for complete search history.

(56) References Cited

U.S. PATENT DOCUMENTS

| 8,026,131 B2 | 9/2011 | Botula et al. | |
| 2010/0244106 A1* | 9/2010 | Parker et al. | 257/288 |
| 2011/0241755 A1* | 10/2011 | Mulawski et al. | 327/427 |
| 2011/0298280 A1 | 12/2011 | Homol et al. | |
| 2014/0001567 A1* | 1/2014 | McPartlin | 257/379 |

OTHER PUBLICATIONS

Botula, A., et al., "A Thin-film SOI 180nm CMOS RF Switch Technology," IEEE Topical Meeting on Silicon Monolithic Integrated Circuits in RF Systems, Jan. 19-21, 2009, pp. 1-4.

(Continued)

*Primary Examiner* — Marcos D. Pizarro
*Assistant Examiner* — Nelson Garces
(74) *Attorney, Agent, or Firm* — Slater & Matsil, L.L.P.

(57) ABSTRACT

A device includes a semiconductor substrate of a first conductivity type, and a deep well region in the semiconductor substrate, wherein the deep well region is of a second conductivity type opposite to the first conductivity type. The device further includes a well region of the first conductivity type over the deep well region. The semiconductor substrate has a top portion overlying the well region, and a bottom portion underlying the deep well region, wherein the top portion and the bottom portion are of the first conductivity type, and have a high resistivity. A gate dielectric is over the semiconductor substrate. A gate electrode is over the gate dielectric. A source region and a drain region extend into the top portion of the semiconductor substrate. The source region, the drain region, the gate dielectric, and the gate electrode form a Radio Frequency (RF) switch.

20 Claims, 8 Drawing Sheets

(51) Int. Cl.
  *H01L 21/98* (2006.01)
  *H01L 29/417* (2006.01)
  *H01L 29/66* (2006.01)
  *H01L 21/761* (2006.01)
  *H01L 29/10* (2006.01)
  *H01L 21/762* (2006.01)

(52) U.S. Cl.
  CPC ...... *H01L29/1083* (2013.01); *H01L 29/41775* (2013.01); *H01L 29/665* (2013.01); *H01L 29/6656* (2013.01); *H01L 29/6659* (2013.01)

(56) References Cited

OTHER PUBLICATIONS

Lee, T-Y., et al., "Modeling of SOI FET for RF Switch Applications," 2010 IEEE Radio Frequency Integrated Circuits Symposium (RFIC), May 23-25, 2010, pp. 479-482.

Tinella, C., et al., "A High-Performance CMOS-SOI Antenna Switch for the 2.5-5-GHz Band," IEEE Journal of Solid-State Circuits, vol. 38, No. 7, Jul. 2003, pp. 1279-1283.

* cited by examiner

RF SWITCH ON HIGH RESISTIVE SUBSTRATE

This application claims the priority of the following provisionally filed U.S. patent application: Application Ser. No. 61/780,002, filed Mar. 13, 2013, and entitled "RF Switch on High Resistive Substrate," which application is hereby incorporated herein by reference.

BACKGROUND

In integrated circuit applications, more and more functions are integrated into products. For example, different functional elements such as 3G video elements, WiFi elements, Bluetooth elements, and audio/video elements may need to be integrated together to form an application. A commonly known application for these devices is the mobile application, in which mobile devices such as cell phones are formed.

High-frequency circuits, which include Radio Frequency (RF) passive devices, are widely used in the mobile applications. The RF passive devices may include capacitors, inductors, transformers, or the like. Due to the high frequency, various design issues were commonly observed. A common problem faced by designers is the signal loss in the substrates that are underlying the high-frequency circuits, which signal loss is partially caused by the parasitic capacitance between the high-frequency circuits and the underlying substrates. Typically, with the increase in the frequency of the signals, the signal loss becomes more severe. This significantly limits the design of high-frequency circuits.

Currently, there are a couple of solutions for reducing the substrate loss. For example, Silicon-On-Insulator (SOI) substrates were used by various groups of people to form the high-frequency circuits. Although the substrate loss may be reduced using this solution, the SOI substrates are typically expensive. In addition, the SOI substrates suffer from third harmonic issues, and hence the circuits formed thereon, for example, Complementary Metal-Oxide-Semiconductor (CMOS) devices, are very difficult to be integrated with the RF passive devices.

In addition, with the high frequency of the signals carried by the high-frequency circuits, the control circuits for operating the RF passive devices need to handle the quick change in the signals, and the control circuits need to have response time short enough to adapt to the change in the high-frequency signals.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Radio-Frequency (RF) switch formed of a Metal-Oxide-Semiconductor (MOS) transistor and the method of forming the same are provided in accordance with various exemplary embodiments. The intermediate stages of forming the RF switch are illustrated. The variations of the embodiments are discussed. Throughout the various views and illustrative embodiments, like reference numbers are used to designate like elements.

Figure 1:
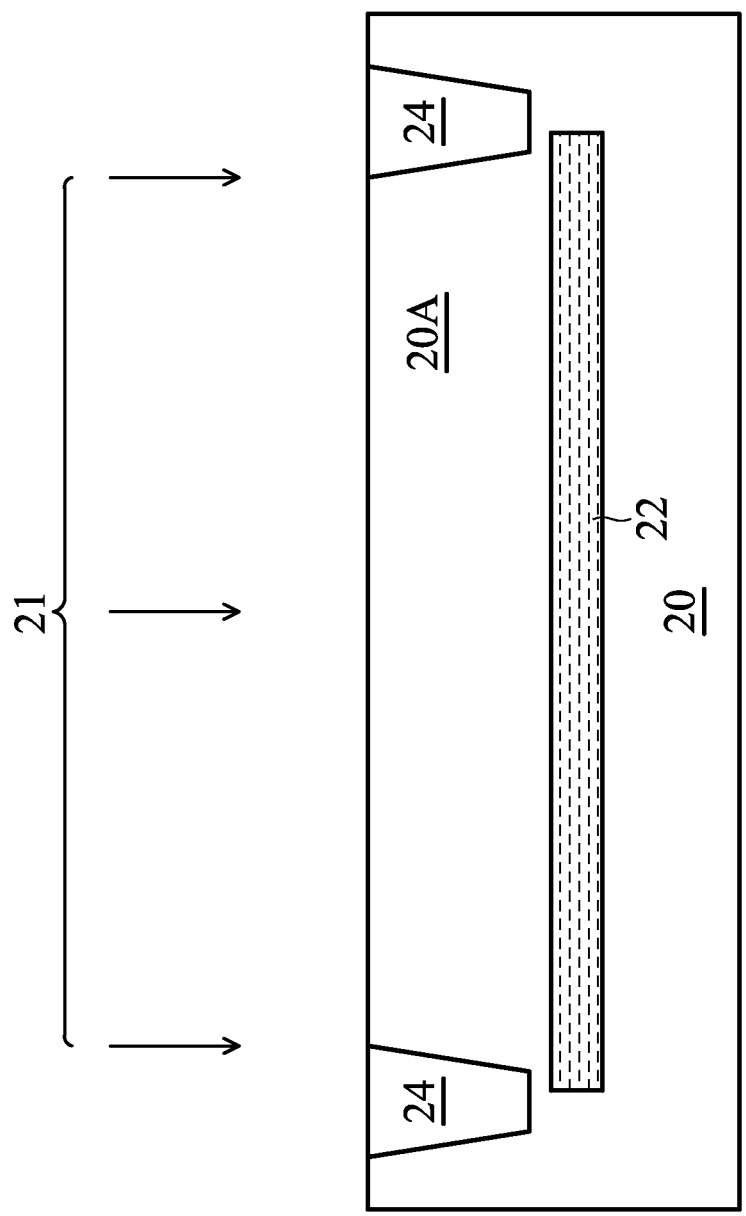
FIGS. 1 through 8 are cross-sectional views of intermediate stages in the manufacturing of a Radio Frequency (RF) switch in accordance with some exemplary embodiments.

Referring to FIG. 1, substrate 20 is provided. Substrate 20 may comprise a semiconductor material such as silicon, although other semiconductor materials such as silicon germanium may be used. Substrate 20 may be lightly doped with a p-type impurity, for example, boron, indium, or combinations thereof. Substrate 20 has a high resistivity, which is higher than about 3,000 ohm-cm, or higher than about 5,000 ohm-cm. The resistivity may also be between about 3,000 ohm-cm and about 250,000 ohm-cm, and may be between about 5,000 ohm-cm and about 20,000 ohm-cm. The resistivity of substrate 20 is significantly higher than the resistivity of typical silicon substrates, which may have resistivity values close to about 10 ohm-cm. Accordingly, substrate 20 is referred to as a high-resistive substrate hereinafter. The respective p-type doping concentration may be between about $5 \times 10^6/cm^3$ and about $5 \times 10^{10}/cm^3$ in accordance with some embodiments. The p-type doping concentration of substrate 20 is also significantly lower than the p-type doping concentration of typical silicon substrates, which may have p-type doping concentrations between about $1 \times 10^{12}/cm^3$ and about $1 \times 10^{15}/cm^3$.

Also referring to FIG. 1, an n-type implantation is performed to implant an n-type impurity into semiconductor substrate 20. The implantation is shown by arrows 21. As a result, Deep N-Well (DNW) 22 is formed at an intermediate level in substrate 20, with a un-implanted substrate portion 20A overlying DNW 22, and a un-implanted portion of substrate 20 underlying DNW 22. The n-type impurity may be selected from phosphorous, arsenic, antimony, or combinations thereof. The implantation energy may be between about 1,000 KeV and about 2,500 KeV. The dosage of the n-type impurity may be between about $1 \times 10^{13}/cm^2$ and about $1 \times 10^{14}/cm^2$. The resulting doping concentration of DNW 22 may be between about $1 \times 10^{13}/cm^3$ and about $1 \times 10^{14}/cm^3$.

As shown in FIG. 1, isolation regions 24 are formed to extend from the top surface of semiconductor substrate 20 into semiconductor substrate 20. In some embodiments, isolation regions 24 are Shallow Trench Isolation (STI) regions. The depth of STI regions 24 may be between about 3,500 Å and about 4,000 Å in some embodiments. In alternative embodiments, isolation regions 24 are oxide regions formed by local oxidation of substrate 20. Isolation regions 24 may comprise silicon oxide in some embodiments. Isolation regions 24 define a portion of substrate 20 as an active region for forming a Metal-Oxide-Semiconductor (CMOS) transistor.

Figure 2:
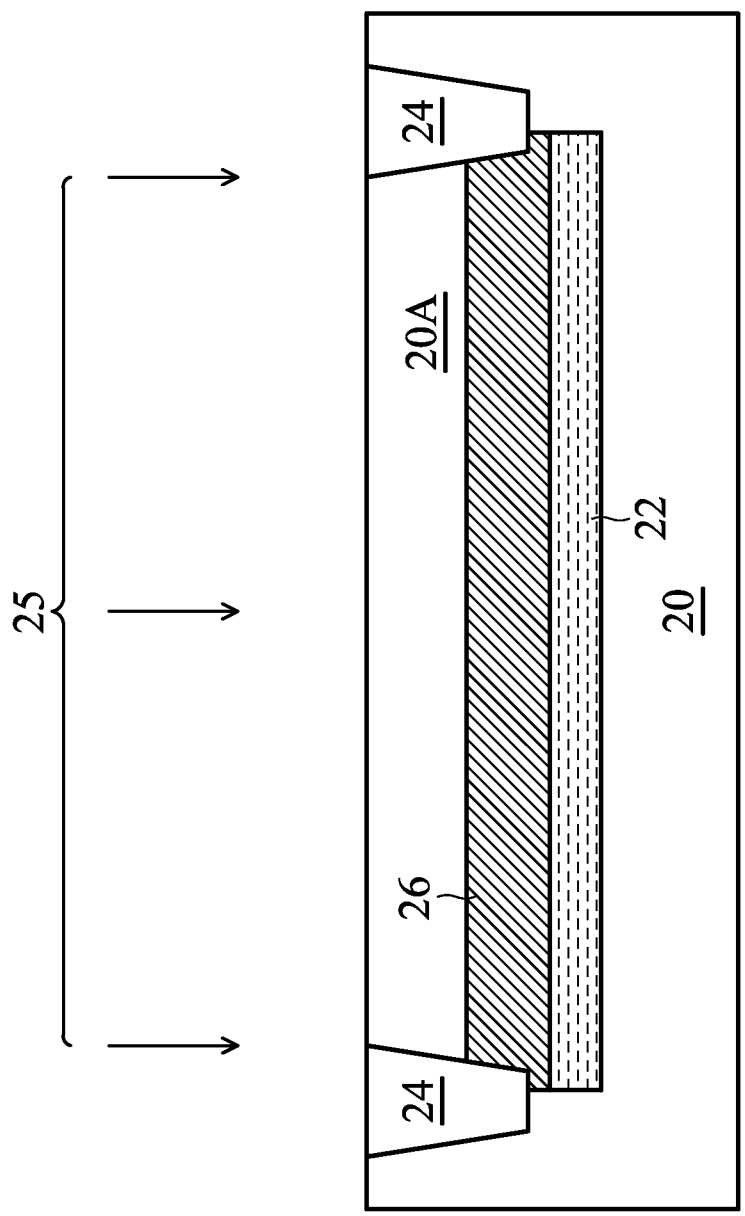

Referring to FIG. 2, a p-type implantation is performed to implant a p-type impurity into semiconductor substrate 20, and hence p-well region 26 is formed. The implantation is shown as arrows 25. In some embodiments, p-well region 26 is over, and may contact, DNW 22. The top surface of p-well region 26 is lower than the top surface of substrate 20. Accordingly, portion 20A of substrate 20 over p-well region 26 remains to be un-implanted with the p-type impurity. It is appreciated that in the implantations for forming DNW 22 and p-well region 26, the implanted impurities may have some ions left in substrate portion 20A. Substrate portion 20A, however, is not intentionally implanted, and the ions left therein will be a small amount. The p-type impurity introduced by implantation 25 may be selected from indium, boron, or the like. In some embodiments, indium is implanted, and the implantation energy is between about 100 KeV and about 130 KeV. The dosage of the p-type impurity may be between about $1 \times 10^{12}/cm^2$ and about $1 \times 10^{14}/cm^2$. The resulting doping concentration of p-well region 26 may be between about $1 \times 10^{11}/cm^3$ and about $1 \times 10^{14}/cm^3$.

In accordance with the embodiments of the present disclosure, the order for forming STI regions 24, DNW 22, and p-well region 26 may be different from that are in the illustrated embodiments, and may be changed to different orders. For example, DNW 22 and p-well region 26 may be formed before the formation of STI regions 24. Also, DNW 22 may be formed after the formation of p-well region 26 in some embodiments.

Figure 3:
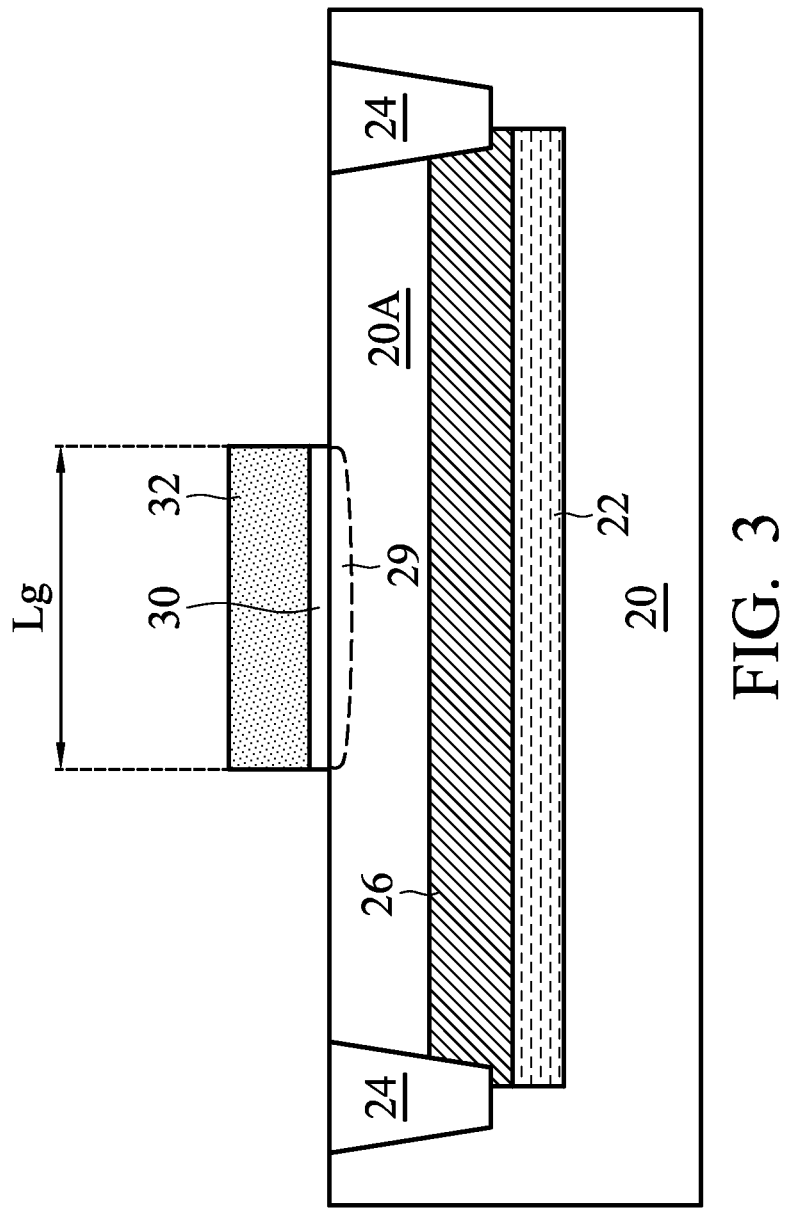

FIG. 3 illustrates the formation of a gate stack, which includes gate dielectric 30 and gate electrode 32. Gate dielectric 30 may be formed of a material selected from silicon oxide, silicon nitride, silicon carbide, silicon oxynitride, combinations thereof, and multi-layers thereof. High-k dielectric materials such as hafnium-based oxides, aluminum-based oxides, lanthanum-based oxides, and combinations thereof, may also be comprised in gate dielectric 30. Gate electrode 32 may be formed of doped polysilicon. Alternatively, metals, metal nitrides, metal silicides, and/or other conductive materials can be used to form gate electrode 32. The formation of gate dielectric 30 and gate electrode 32 includes forming a blanket gate dielectric layer and a blanket gate electrode layer over the blanket gate dielectric layer, and then patterning the blanket gate dielectric layer and the blanket gate electrode layer. In accordance with some embodiments, gate length Lg of gate electrode 32 is smaller than about 0.3 μm.

In accordance with the embodiments of the present disclosure, no channel doping is performed. It is appreciated that in the formation of conventional MOS transistors, channel dopings may be performed to increase the doping concentrations in the channels of the respective MOS transistors. In the conventional channel doping for forming NMOS transistors, p-type channel doping may be performed through implanting a p-type impurity into the channels of the NMOS transistors. For forming PMOS transistors, n-type channel doping may be performed through implanting an n-type impurity into the channels of the PMOS transistors. In the embodiments of the present disclosure, no channel doping implantation is performed. This results in the channel doping concentration, which is in the channel 29 that is overlapped by gate electrode 32, to be very low. In accordance with some embodiments, channel region 29 has a p-type doping concentration lower than about $10^{13}/cm^3$. The threshold voltage of the resulting transistor is thus low. Hence, the MOS transistors formed in accordance with the embodiments have very fast switching time, and are suitable for being used as RF switches.

Figure 4:
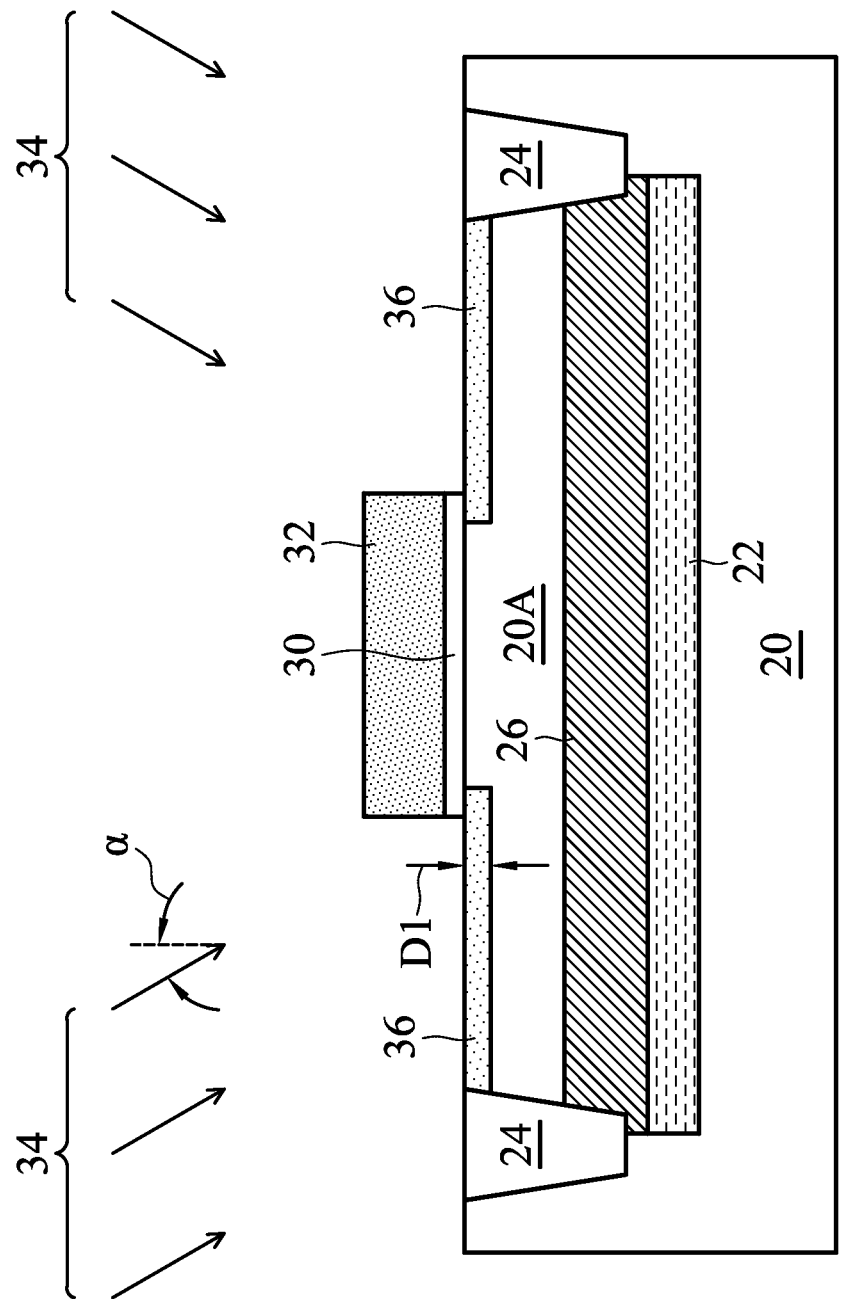

Referring to FIG. 4, tilt implantations 34 are performed to form Lightly Doped Drain/Source (LDD) regions 36, wherein the tilt implantation are tilted from the opposite sides of gate electrode 32. The implanted impurity may include an n-type impurity such as phosphorous, arsenic, or combinations thereof. The tilt implantation may be performed at tilt angle α, which may be smaller than about 15 degrees, for example. Due to the tilt implantation, LDD regions 36 extend underlying gate dielectric 30 and gate electrode 32, with a portion of each of LDD regions 36 overlapped by gate dielectric 30 and gate electrode 32. The energy for implanting the n-type impurity, for example, arsenic, may be between about 2 KeV and about 10 KeV. Hence, LDD regions 36 are very shallow, and depth D1 of LDD regions 36 may be smaller than about 50 nm.

Figure 5:
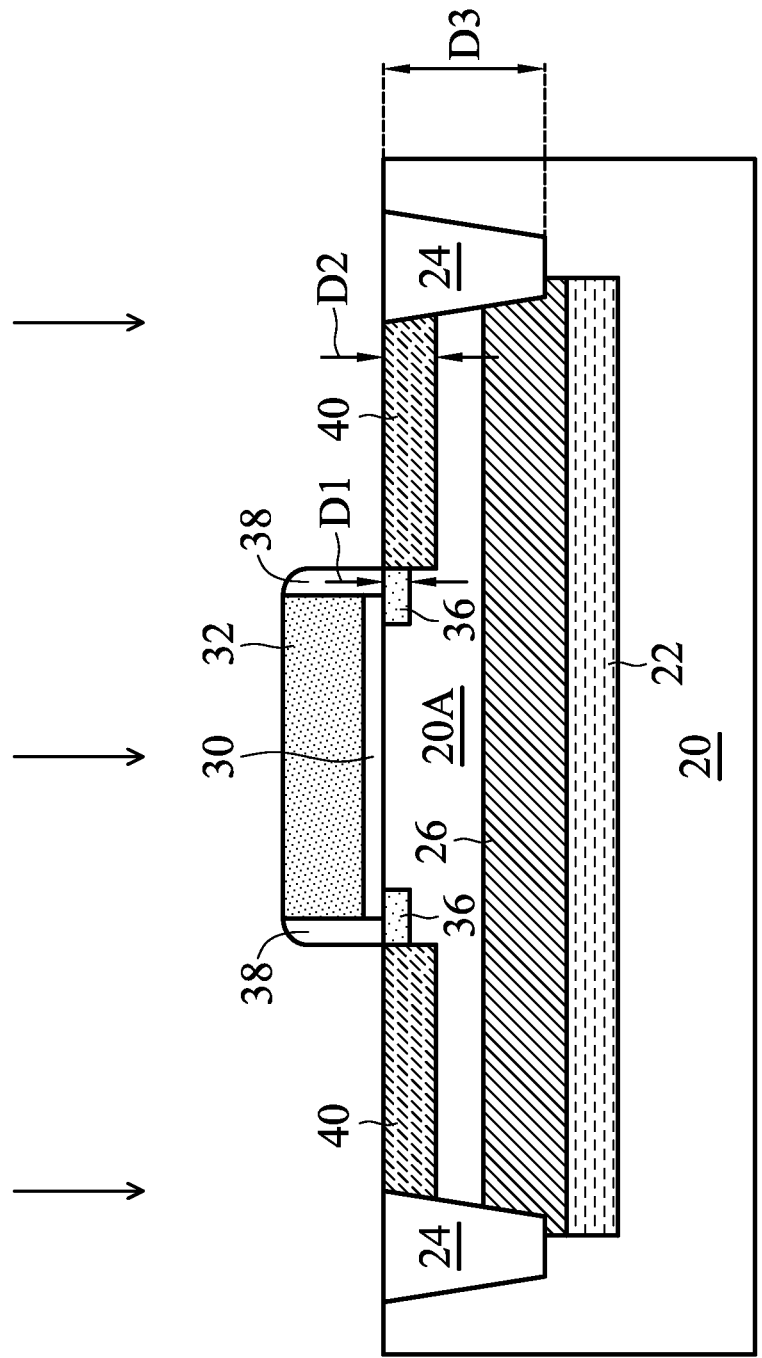

Referring to FIG. 5, gate spacers 38 and heavily doped source and drain regions 40 (referred to as source/drain regions hereinafter) are formed. In accordance with some embodiments, gate spacers 38 are formed first, followed by performing an implantation to form source/drain regions 40. Hence, source/drain regions 40 have inner edges aligned to the outer edges of gate spacers 38. In alternative embodiments, an implantation is performed to form source/drain regions 40, followed by the formation of gate spacers 38. Hence, source/drain regions 40 have inner edges aligned to the edges of gate electrode 32. During the formation of source/drain regions 40, an n-type impurity such as arsenic, phosphorous, or the like, is implanted. In the embodiments wherein arsenic is implanted, the implantation energy may be between about 2 KeV and about 10 KeV. Hence, source/drain regions 40 are also very shallow, and depth D2 of source/drain regions 40 may be smaller than about 50 nm. In some embodiments, depth D1 of LDD regions 36 and depth D2 of source/drain regions 40 are substantially equal to each other. In certain embodiments, a difference between depths D1 and D2 may be smaller than about 5 percent, and may be between about 3 percent and about 5 percent.

The bottoms of LDD regions 36 and source/drain regions 40 are spaced apart from the top surface of p-well region 26 by substrate portion 20A. Hence, LDD regions 36 and source/drain regions 40 form junctions with substrate portion 20A, which have a very low p-type impurity concentration.

Figure 6:
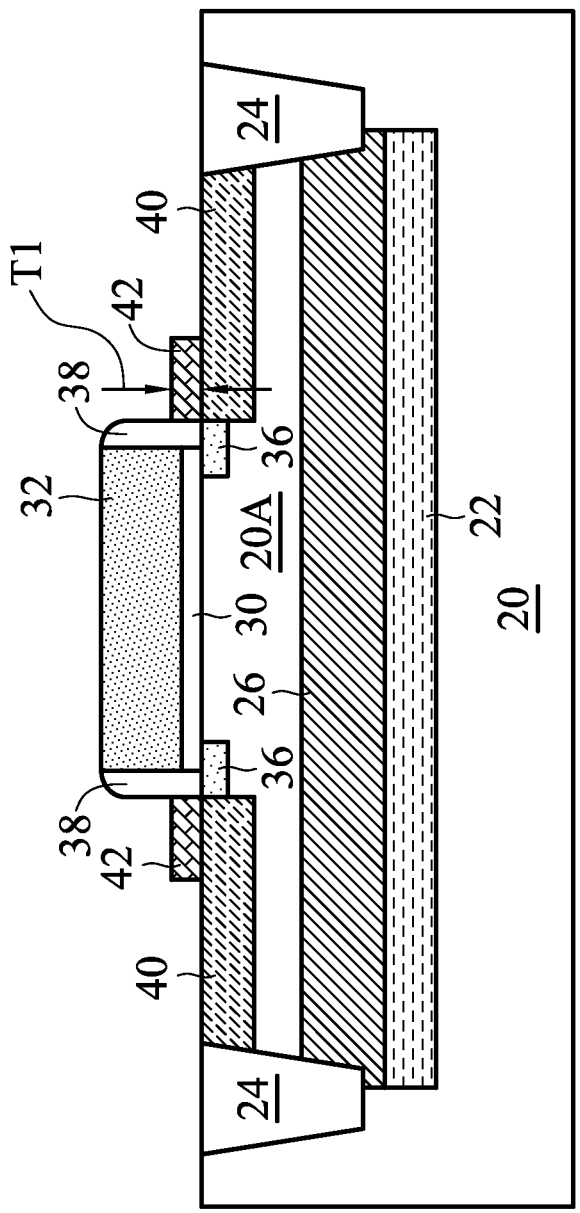

FIG. 6 illustrates the formation of dielectric layers 42, which are formed to overlap and contact source/drain regions 40. In accordance with some embodiments, each of dielectric layers 42 is in contact with one of gate spacers 38, and extends away from the respective gate spacers 38. The material of dielectric layers 42 may include oxide, nitride, carbide, oxynitride, and/or the like, and may be formed using Chemical Vapor deposition (CVD) methods such as Plasma Enhanced Chemical Vapor Deposition (PECVD), Atomic Layer Deposition (ALD), or the like. Thickness T1 of dielectric layers 42 may be between about 10 nm and about 50 nm. The top surface of dielectric layers 42 may be lower than the top surface of gate electrode 32 in some embodiments. The formation of dielectric layers 42 may include forming a blanket dielectric layer (not shown), forming a photo resist (not shown) over the blanket dielectric layer and patterning the photo resist, and then etching the blanket dielectric layer to form dielectric layers 42. Hence, dielectric layers 42, unlike gate spacers 38 that have sloped top surfaces, may have some top surfaces that are substantially flat.

Figure 7:
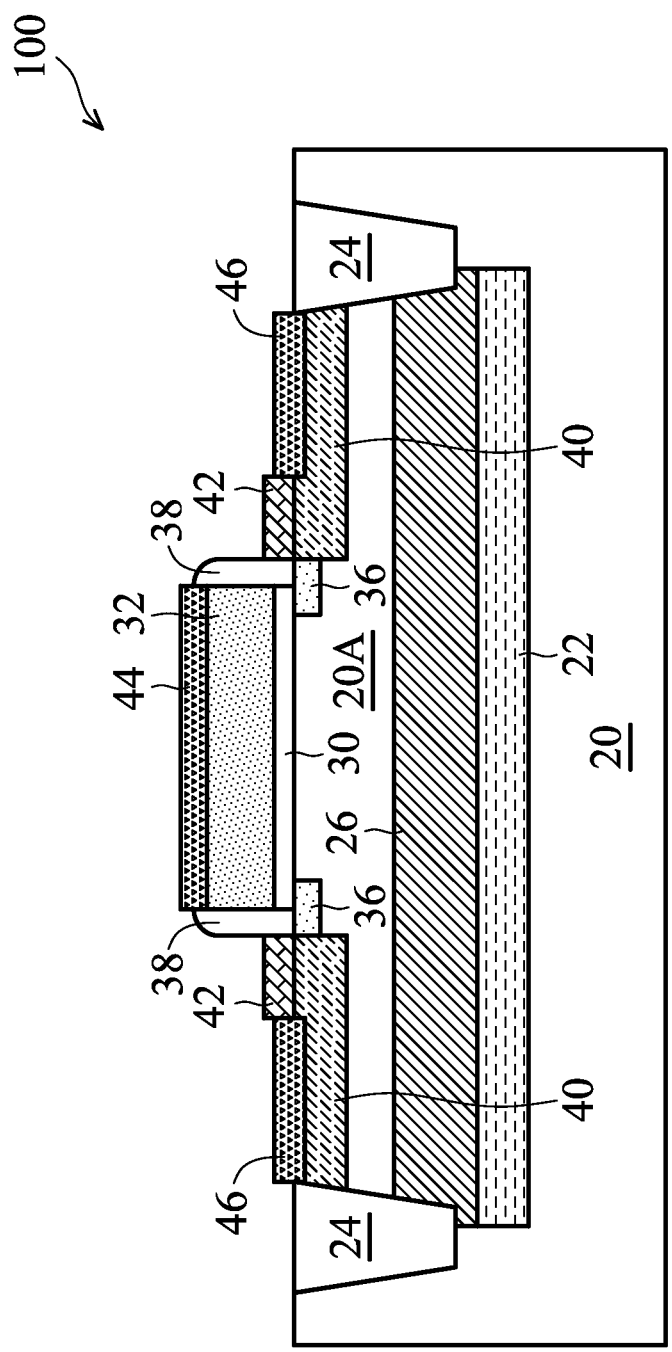

Next, referring to FIG. 7, gate silicide 44 and source/drain silicide regions 46 are formed. The formation of gate silicide 44 and source/drain silicide regions 46 may include forming a metal layer (not shown), which may include nickel, cobalt, or the like, on the structure shown in FIG. 6. An annealing is then performed, during which the exposed silicon reacts with the metal layer to form silicide regions 44 and 46. The portions of the metal layer unreacted with the metal layer are removed, leaving gate silicide 44 and source/drain silicide regions 46. Due to the formation of dielectric layers 42, source/drain silicide regions 46 are pushed farther away from gate electrode 32, and hence the breakdown voltage between, for example, gate electrode 32 and drain region 40 is increased. MOS transistor 100 is thus formed. MOS transistor 100 may be used as an RF switch.

Figure 8:
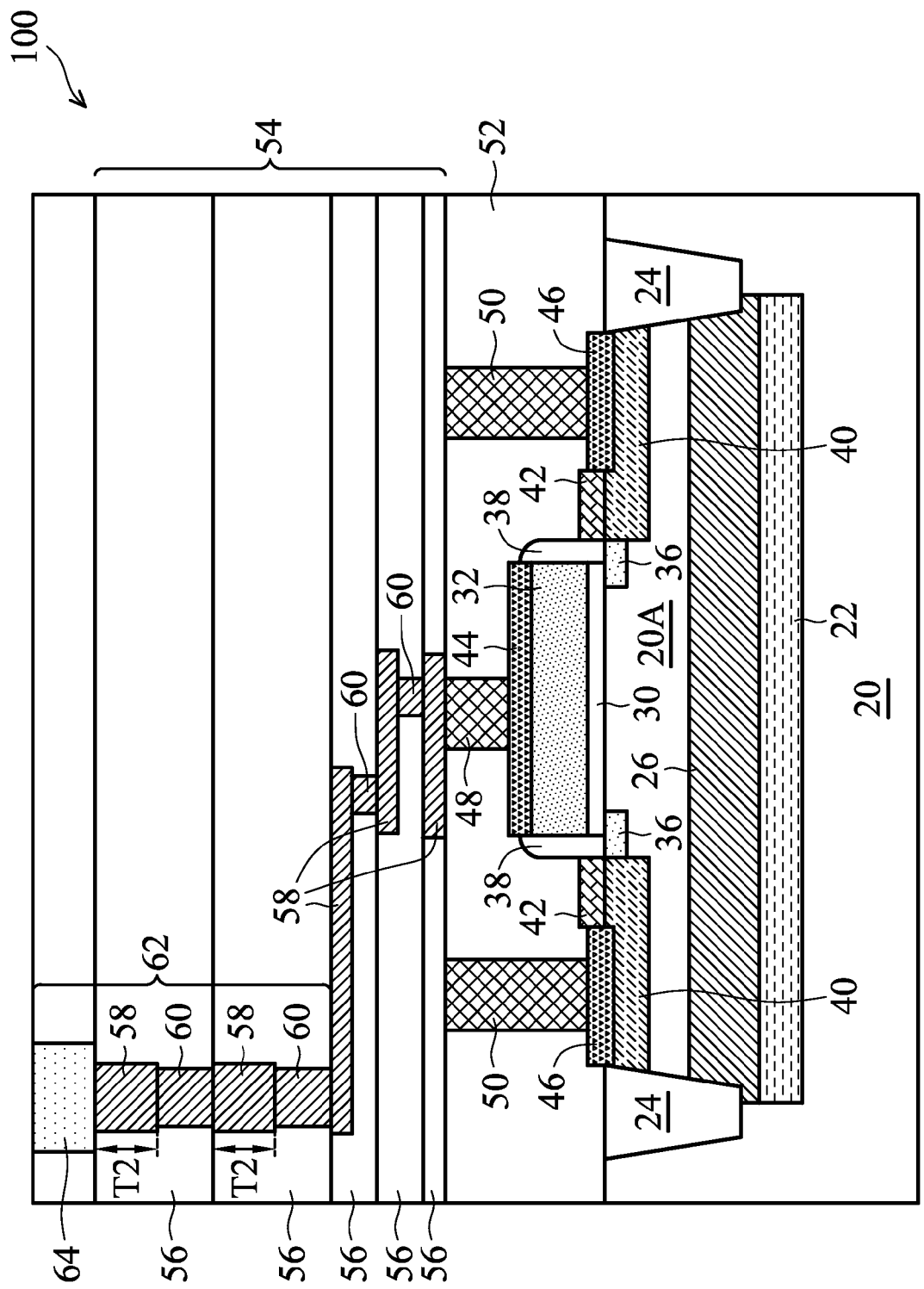

FIG. 8 illustrates the Back End of Line (BEOL) processes, in which gate contact plug 48, source/drain contact plugs 50, and Inter-Layer Dielectric (ILD) 52 are formed. Gate contact plug 48 and source/drain contact plugs 50 are electrically connected to gate electrode 32 and source/drain regions 40, respectively. Next, interconnect structure 54 is formed. Interconnect structure 54 may include a plurality of dielectric layers 56. In some embodiments, dielectric layers 56 are low-k dielectric layers having dielectric constants (k values) smaller than about 3.5, for example. The k values of low-k dielectric layers 56 may also be lower than about 3.0. Metal lines 58 and vias 60 are formed in dielectric layers 56. Some metal lines 58 and vias 60 are electrically coupled to MOS transistor 100. The metal lines in a same layer are collectively referred to as a metal layer.

As also shown in FIG. 8, RF passive device 62 is formed in the BEOL process. RF passive device 62 may be a capacitor, an inductor, a transformer, a transmission line, a waveguide, or the like, whose characteristics (such as the frequency response and the Q factor) are suitable for being operated in RF frequency range (about 500 MHz or higher). FIG. 8 illustrates the cross-sectional view of a part of RF passive device 62. In some embodiments, RF passive device 62 extends into one or more of the metal layers in interconnect structure 54, wherein thickness T2 of each of the metal layers may be, for example, greater than about 1 µm, and may be between about 1 µm and about 5 µm. Passive device 62 may also extend into an aluminum-containing layer (such as an aluminum copper layer) 64. Through the stacking of the plurality of metal layers and the aluminum-containing layer, the thickness of RF passive device 62 is great enough, and hence RF passive device 62 may be operated under high frequencies.

Although the previously discussed embodiments provide a method of forming an RF switch comprising an NMOS device, the teaching provided in the present disclosure is readily available for the formation of RF switches comprising PMOS devices, with the conductivity types of the respective substrate, well regions, LDD regions, and/or source/drain regions inverted.

In accordance with the embodiments of the present disclosure, MOS transistor 100 acts as an RF switch, which may be operated by the signals that are provided by RF passive device 62. Since RF switch 100 is formed based on substrate 20 that has a high resistivity, the insertion loss of the RF switch is very low. Simulation results revealed that the insertion loss of the RF switch formed in accordance with the embodiments of the present disclosure is about 0.34 dB, which is significantly lower than the specification requirement (lower than 1 dB). Furthermore, the switching time of the RF switch formed in accordance with the embodiments of the present disclosure is about 60 nanoseconds, which is significantly lower than the specification requirement (about 500 nanoseconds). Hence, the RF switch formed in accordance with the embodiments of the present disclosure may meet the specification requirement with a significant margin.

In accordance with some embodiments, a device includes a semiconductor substrate of a first conductivity type, and a deep well region in the semiconductor substrate, wherein the deep well region is of a second conductivity type opposite to the first conductivity type. The device further includes a well region of the first conductivity type over the deep well region. The semiconductor substrate has a top portion overlying the well region, and a bottom portion underlying the deep well region, wherein the top portion and the bottom portion are of the first conductivity type, and have a high resistivity. A gate dielectric is over the top portion of the semiconductor substrate. A gate electrode is over the gate dielectric. A source region and a drain region extend into the top portion of the semiconductor substrate, wherein the source region and the drain region are spaced apart from the well region by the top portion of the semiconductor substrate. The source region, the drain region, the gate dielectric, and the gate electrode form an RF switch configured to operate in a RF frequency range.

In accordance with other embodiments, a device includes a semiconductor substrate, a deep n-well region in the semiconductor substrate, and a p-well region over and contacting the deep n-well region. The semiconductor substrate includes a top portion overlying the p-well region and a bottom portion underlying the deep n-well region. The top portion and the bottom portion are of p-type. The bottom portion has a resistivity greater than about 5,000 ohm-cm. The device further includes an RF switch, which includes a gate dielectric over the top portion of the semiconductor substrate, a gate electrode over the gate dielectric, and a source region and a drain region extending into the top portion of the semiconductor substrate. The source region and the drain region are spaced apart from the p-well region by the top portion of the semiconductor substrate. An RF passive device is overlying and electrically coupled to the RF switch.

In accordance with yet other embodiments, a method includes performing a first implantation to implant a semiconductor substrate to form a deep well region, wherein the semiconductor substrate is of a first conductivity type, and has a resistivity higher than about 5,000 ohm-cm. In the first implantation, an impurity of a second conductivity type opposite to the first conductivity type is implanted. A second implantation is performed to implant the semiconductor substrate, wherein a well region of the first conductivity type is formed over the deep well region. After the first and the second implantations, the semiconductor substrate includes a top portion overlying the well region and a bottom portion underlying the deep well region, wherein the top portion and the bottom portion are substantially un-implanted in the first and the second implantations. The method further includes forming a gate dielectric over the top portion of the semiconductor substrate, forming a gate electrode over the gate dielectric, and performing a third implantation to implant the top portion of the semiconductor substrate to form a source region and a drain region. The source region and the drain region are spaced apart from the well region by a remaining top portion of the semiconductor substrate. The source region, the drain region, the gate dielectric, and the gate electrode form an RF switch configured to operate in a RF frequency range.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate of a first conductivity type;
a deep well region in the semiconductor substrate, wherein the deep well region is of a second conductivity type opposite to the first conductivity type;
a well region of the first conductivity type over the deep well region, wherein the semiconductor substrate comprises:
 a top portion overlying the well region; and
 a bottom portion underlying the deep well region, wherein the top portion and the bottom portion are of the first conductivity type, and have a high resistivity;
a gate dielectric over the top portion of the semiconductor substrate;
a gate electrode over the gate dielectric;
a gate spacer on a sidewall of the gate electrode;
a source region and a drain region extending into the top portion of the semiconductor substrate, wherein the source region and the drain region are spaced apart from the well region by the top portion of the semiconductor substrate, and wherein the source region, the drain region, the gate dielectric, and the gate electrode form a Radio Frequency (RF) switch configured to operate in a RF frequency range; and
a dielectric layer comprising a portion over and contacting one of the source region and the drain region, wherein the dielectric layer comprises a first edge contacting a second edge of the gate spacer, with the first edge extending to contact a top surface of the one of the source region and the drain region.

2. The device of claim 1 further comprising:
an RF passive device overlying and electrically coupled to the RF switch, wherein the gate electrode is serially and directly connected to an end of the RF passive device, wherein the RF passive device is selected from the group consisting essentially of a capacitor, an inductor, a transformer, a transmission line, a waveguide, and combinations thereof.

3. The device of claim 1, wherein the high resistivity of the semiconductor substrate is higher than about 5,000 ohm-cm.

4. The device of claim 1, wherein the high resistivity is between about 5,000 ohm-cm and about 20,000 ohm-cm.

5. The device of claim 1, wherein the source region and the drain region have a depth smaller than about 50 nm.

6. The device of claim 1 further comprising:
a source/drain silicide having an edge aligned to an edge of the dielectric layer, wherein the dielectric layer is between the gate spacer and the source/drain silicide, wherein the dielectric layer comprises a substantially flat top surface extending from the source/drain silicide to the gate spacer.

7. The device of claim 1 further comprising a lightly doped drain/source region extending underlying the gate dielectric, wherein the lightly doped drain/source region has a depth smaller than about 50 nm.

8. A device comprising:
a semiconductor substrate;
a deep n-well region in the semiconductor substrate;
a p-well region over and contacting the deep n-well region, wherein the semiconductor substrate comprises:
 a top portion overlying the p-well region; and
 a bottom portion underlying the deep n-well region, wherein the top portion and the bottom portion are of p-type, and wherein both the top portion and the bottom portion have a resistivity greater than about 5,000 ohm-cm;
a Radio Frequency (RF) switch comprising:
 a gate dielectric over the top portion of the semiconductor substrate;
 a gate electrode over the gate dielectric; and
 a source region and a drain region extending into the top portion of the semiconductor substrate, wherein the source region and the drain region are spaced apart from the p-well region by the top portion of the semiconductor substrate; and
an RF passive device overlying and electrically coupled to the RF switch.

9. The device of claim 8, wherein the RF passive device is directly connected to the gate electrode, and the RF passive device is selected from the group consisting essentially of a capacitor, an inductor, a transformer, a transmission line, a waveguide, and combinations thereof.

10. The device of claim 8, wherein the top portion of the semiconductor substrate that separates the source region and the drain region from the p-well region has a resistivity between about 5,000 ohm-cm and about 20,000 ohm-cm.

11. The device of claim 8 further comprising:
a gate spacer on a sidewall of the gate electrode;
a dielectric layer comprising a portion over and contacting one of the source region and the drain region, wherein the dielectric layer comprises a first edge contacting a second edge of the gate spacer, with the first edge extending to a top surface of the one of the source region and the drain region; and
a source/drain silicide having an edge aligned to an edge of the dielectric layer.

12. The device of claim 8, wherein the RF passive device is selected from the group consisting essentially of a capacitor, an inductor, a transformer, a transmission line, a waveguide, and combinations thereof.

13. The device of claim 8, wherein the resistivity of the bottom portion of the semiconductor substrate is between about 5,000 ohm-cm and about 20,000 ohm-cm.

14. The device of claim 8 further comprising a Shallow Trench Isolation (STI) region extending into the semiconductor substrate, wherein the STI region has a first depth, and wherein the source region and the drain region have second depths smaller than about 5 percent the first depth.

15. A device comprising:
a semiconductor substrate;
a well region in the semiconductor substrate;
a gate stack overlapping a top portion of the semiconductor substrate spacing the gate stack apart from the well region, with the top portion of the semiconductor substrate having a resistivity higher than about 5,000 ohm-cm;
a gate spacer on a sidewall of the gate stack;
a source/drain region on a side of the gate stack, wherein an edge of the source/drain region is aligned to an outer edge of the gate spacer;
a silicide region over and contacting the source/drain region; and
a dielectric layer overlapping and in physical contact with the source/drain region, wherein the dielectric layer comprises an outer edge aligned to an inner edge of the silicide region, and an inner edge contacting the outer edge of the gate spacer.

16. The device of claim 15, wherein the dielectric layer has a flat top surface, and both the inner edge and the outer edge extend to contact the source/drain region.

17. The device of claim 15, wherein the dielectric layer is in physical contact with the silicide region and the gate spacer, and the dielectric layer comprises a substantially flat top surface extending from the silicide region to the gate spacer.

18. The device of claim 15 further comprising a deep well region in the semiconductor substrate, with the deep well region being of a conductivity type opposite to a conductivity type of the well region, wherein a top surface of deep well region is in contact with a bottom surface of the well region.

19. The device of claim 15, wherein the resistivity is between about 5,000 ohm-cm and about 20,000 ohm-cm.

20. The device of claim 15 further comprising a Radio Frequency (RF) passive device overlying, wherein the gate stack is connected to an end of the RF passive device.

* * * * *